(12) United States Patent
Flynn et al.

(10) Patent No.: US 8,125,245 B2
(45) Date of Patent: Feb. 28, 2012

(54) CIRCUITRY FOR MATCHING THE UP AND DOWN IMPEDANCES OF A VOLTAGE-MODE TRANSMITTER

(75) Inventors: James P. Flynn, Beaverton, OR (US); Junqi Hua, Portland, OR (US); John T. Stonick, Portland, OR (US); Daniel K. Weinlader, Allentown, PA (US); Jianping Wen, Beaverton, OR (US); Skye Wolfer, Hillsboro, OR (US); David A. Yokoyama-Martin, Portland, OR (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 12/819,650

(22) Filed: Jun. 21, 2010

(65) Prior Publication Data
US 2011/0309857 A1 Dec. 22, 2011

(51) Int. Cl.
*H03K 19/094* (2006.01)
(52) U.S. Cl. ............ 326/87; 326/86; 327/109; 327/112
(58) Field of Classification Search .................. 326/30, 326/82–83, 86–87; 327/108–109, 112
See application file for complete search history.

(56) References Cited

U.S. PATENT DOCUMENTS

| | | | |
|---|---|---|---|
| 7,071,739 B1 * | 7/2006 | Duzevik et al. | 327/108 |
| 7,236,004 B1 * | 6/2007 | Zhou et al. | 326/33 |
| 7,388,405 B2 * | 6/2008 | Tokunaga et al. | 326/83 |
| 7,635,990 B1 * | 12/2009 | Ren et al. | 326/86 |
| 7,728,630 B1 * | 6/2010 | Ren et al. | 326/86 |
| 2004/0263204 A1 * | 12/2004 | Chandler et al. | 326/30 |

OTHER PUBLICATIONS

Dettloff, Wayne D. et al., "A 32mW 7.4Gb/s Protocol-Agile Source-Series-Terminated Transmitter in 45nm CMOS SOI", 2010 IEEE International Solid-State Circuits Conference, ISSCC 2010/Session 20/ Next-Generation Optical & Electrical Interfaces/ 20.6, pp. 370-372.
Wong, Koon-Lun Jackie et al., "A 27-mW 3.6-Gb/s I/O Transceiver", IEEE Journal of Solid-State Circuits, vol. 39, No. 4, Apr. 2004, pp. 602-612.

* cited by examiner

*Primary Examiner* — Jason M Crawford
(74) *Attorney, Agent, or Firm* — Park, Vaughan, Fleming & Dowler LLP; Laxman Sahasrabuddhe

(57) ABSTRACT

Some embodiments of the present invention provide a voltage-mode transmitter. The transmitter can include configuration circuitry, bias circuitry, and a set of driver slices. Each driver slice can include driver transistors which drive an output value. The outputs of each driver slice can be directly or capacitively coupled with the transmitter's outputs. Each driver slice can also include one or more impedance-matching transistors which are serially coupled to at least some of the driver transistors. The configuration circuitry can configure a subset of driver slices so that the down (or up) impedance of the transmitter is within a first tolerance of a desired impedance value. The bias circuitry can bias the one or more impedance-matching transistors in each driver slice in the subset of driver slices so that the up (or down) impedance is within a second tolerance of the down (or up) impedance.

24 Claims, 4 Drawing Sheets

DIFFERENTIAL
DRIVER
200

DIFFERENTIAL
DRIVER
200

CIRCUITRY FOR MATCHING THE UP AND DOWN IMPEDANCES OF A VOLTAGE-MODE TRANSMITTER

BACKGROUND

1. Technical Field

This disclosure generally relates to communication circuitry.

More specifically, this disclosure relates to circuitry for matching the up and down impedances of a voltage-mode transmitter.

2. Related Art

Modern communication devices use voltage-mode transmitters partly because they use less power than their current-mode counterparts. Most high-speed communication standards impose stringent requirements on the characteristics of voltage-mode transmitters. Specifically, some standards require that a transmitter must not only output a differential voltage at a desired magnitude, but that the transmitter's output impedance must match the impedance of the signal traces of the channel on the circuit board in order to minimize reflections which can impair signal integrity.

A voltage-mode transmitter's output can be viewed as having two impedances: an up impedance looking up to the power supply voltage (e.g., VTT), and a down impedance looking down to ground. In addition to ensuring that the overall impedance of the transmitter matches a desired value (e.g., the impedance of the signal traces in the circuit board), the up and down impedances must also match each other. A mismatch between the up and down impedances of a transmitter can cause a mismatch in the rise and fall times of the differential voltage signal, and can cause excessive common mode noise. This, in turn, can degrade the transmitter's performance and can violate the specifications of the high-speed communication standard.

The relentless miniaturization of integrated circuits has increased the variability in the electrical characteristics of circuit elements. Moreover, the behavior of circuit elements changes with changing operating conditions. Hence, even if the transmitter's up and down impedances match at nominal operating conditions (e.g., at the nominal voltage and temperature), the impedances may not match once the operating conditions change.

Hence, what is needed are systems and techniques for ensuring that the overall impedance of a transistor matches a desired value, and that the up and down impedances of the transmitter match each other.

SUMMARY

Some embodiments of the present invention provide a voltage-mode transmitter design which, even under varying process and operating conditions, ensures that the overall impedance substantially matches a desired value, and that the up and down impedances substantially match each other.

In some embodiments, the voltage-mode transmitter can be a voltage-mode differential transmitter which includes a set of differential driver slices. The transmitter can also include configuration circuitry and bias circuitry which are used to control the impedances. Each differential driver slice can include driver transistors which drive a pair of differential output values: a first value through a first driver output and a second value through a second driver output. The first driver output of each driver slice can be directly or capacitively coupled to a first transmitter output, and the second driver output of each driver slice can be directly or capacitively coupled to a second transmitter output. Further, each driver slice can include one or more impedance-matching transistors which can be serially coupled to at least some of the driver transistors.

In some embodiments, the voltage-mode transmitter can be a voltage-mode single-ended transmitter which includes a set of single-ended driver slices. The transmitter can also include configuration circuitry and bias circuitry which are used to control the impedances. Each single-ended driver slice can include driver transistors which drive an output value through a driver output. The driver outputs of each driver slice can be directly or capacitively coupled to a transmitter output. Further, each driver slice can include one or more impedance-matching transistors which can be serially coupled to at least some of the driver transistors.

The configuration circuitry can be capable of configuring a subset of single-ended or differential driver slices so that a first impedance value between a transmitter output and a first power supply node (e.g., ground) is within a tolerance (e.g., ±5%) of a desired impedance value. The configuration circuitry may use an off-chip precision component, such as a precision resistor, as a reference. The bias circuitry can be capable of biasing the one or more impedance-matching transistors in each driver slice in the subset of driver slices so that a second impedance value between the transmitter output and a second power supply node (e.g., VTT) is within a tolerance (e.g., ±1%) of the first impedance value. Typically the tolerance for matching the up and down impedances is stricter than the tolerance for matching the overall impedance of the transmitter with the signal trace impedance.

In some embodiments, the bias circuitry can include one or more replica slices. Each replica slice can include driver transistors which drive an output value through a driver output, and one or more impedance-matching transistors which are serially coupled to the driver transistors. The bias circuitry can further include an operational amplifier. One input of the operational amplifier can receive a voltage value that is an average (e.g., VTT/2) of the voltage values of the first power supply node (e.g., ground) and the second power supply node (e.g., VTT). The other input of the operational amplifier can be coupled to the output of the one or more replica slices. The output voltage of the operational amplifier can be supplied as a bias voltage to the impedance-matching transistor in the one or more replica slices and the impedance-matching transistors in the set of driver slices.

In some embodiments, the bias circuit can include a filter which is coupled to the transmitter's outputs. The output of the filter can be indicative of the DC value of the transmitter's outputs, which can indicate the matching of the up and down impedances. For example, the filter can be a low-pass filter that indicates the DC level of the single-ended or differential outputs of the transmitter. In these embodiments, the bias circuit can also include an operational amplifier. One input of the operational amplifier can receive a voltage value that is an average (e.g., VTT/2) of the voltage values of the first power supply node (e.g., ground) and the second power supply node (e.g., VTT). The other input of the operational amplifier can be coupled to the output of the filter. The output voltage of the operational amplifier can be supplied as a bias voltage to the impedance-matching transistors in the set of driver slices.

In some embodiments, each driver slice is capable of being configured to perform a function from a predetermined set of functions. Specifically, the predetermined set of functions can include a driver function, an attenuation function, and an equalization function. Each driver slice can also be turned off by configuring the driver slice to be in a high-impedance or tri-state mode.

In some embodiments, the transmitter can include multiple replica slices, each with its own bias circuitry. Each replica slice can then be used to bias driver slices which match the replica slice.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Figure 1:
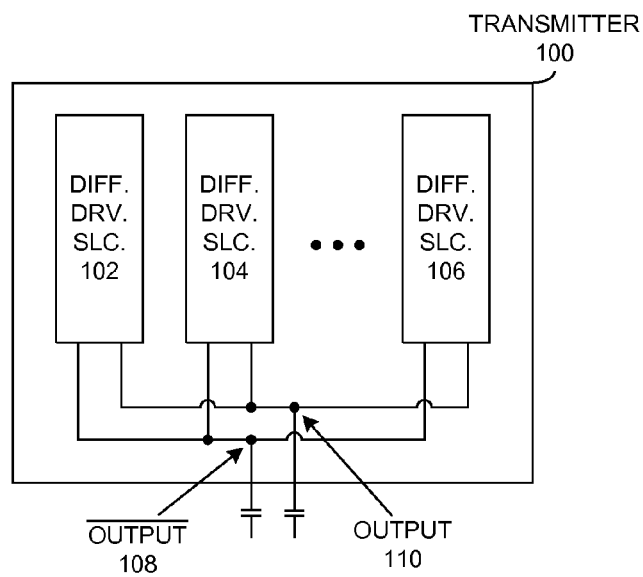
FIG. 1 illustrates a voltage-mode differential transmitter which includes multiple differential driver slices.

FIG. 1 illustrates a voltage-mode differential transmitter 100 which includes multiple differential driver slices, namely, differential driver slices 102-106. The differential outputs of the differential driver slices are coupled with the transmitter's differential outputs 108 and 110. The transmitter's differential outputs 108 and 110 can be capacitively coupled with the transmission channels (e.g., signal traces on the circuit board). During operation, each differential driver slice outputs a voltage signal which is combined to create the transmitter's differential voltage signal. The impedance at the transmitter's differential outputs is determined by combining the impedances of the differential driver slices in parallel. In a single-ended transmitter, each driver slice may have only one output, and the output voltage signal and the output impedance of the transmitter may be determined by combining the output voltage signals and the output impedances, respectively, of the driver slices.

Figure 2A:
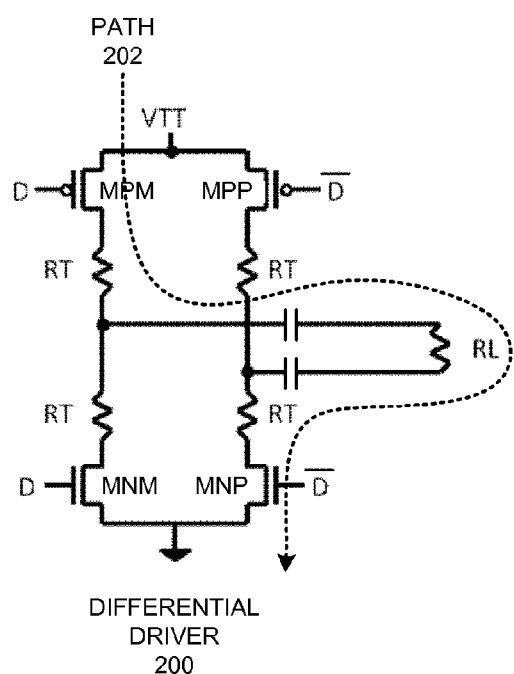
FIGS. 2A and 2B illustrate a differential voltage-mode driver.
Figure 2B:
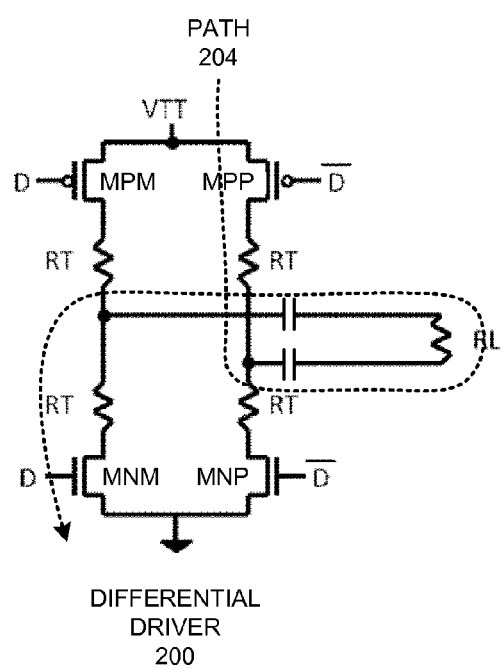

FIGS. 2A and 2B illustrate a differential voltage-mode driver. Note that each differential driver slice shown in FIG. 1 can be a differential driver as shown in FIGS. 2A and 2B. Differential driver 200 operates between VTT and ground, and includes p-type transistors (e.g., p-channel metal-oxide-semiconductor field-effect transistors) MPM and MPP, and n-type transistors (e.g., n-channel metal-oxide-semiconductor field-effect transistors) MNM and MNP. Resistance RT can be chosen to ensure that the output impedance of the differential driver is a desired value. Differential driver 200 drives load RL during operation. The voltage swing at the outputs of differential driver 200 is determined by the load RL and the effective impedance at the outputs of the differential driver 200.

Gate voltages that correspond to data bit D and its complement D are supplied to the gates of the transistors as shown in FIGS. 2A and 2B. For example, a high gate voltage may correspond to D=1, and a low gate voltage may correspond to D=0. In this scenario, a transient current flows through path 202 when D transitions from 1 to 0, and a transient current flows through path 204 when D transitions from 0 to 1. A single-ended driver may include only one half (e.g., the left half or the right half) of a differential driver.

Note that there are two impedances from an output of a single-ended or a differential driver: an up impedance between the output and VTT and a down impedance between the output and ground. A mismatch in these impedances can cause excessive common mode noise which can degrade the transmission performance of the differential driver.

Due to variations in process conditions, it is very difficult, if not impossible, to ensure that the up and down impedances match in a manufactured chip. To combat this problem, some transmitter designs use multiple driver slices as shown in FIG. 1. The transmitter can turn on a subset of the driver slices so that the impedance of the transmitter is a desired value. Specifically, during calibration, an off-chip resistance can be used to determine how many slices need to be used, and that number of slices can be turned on by the transmitter.

Unfortunately, this approach only allows the transmitter to control one of the two impedances. Specifically, if the transmitter tries to achieve a desired value for the up impedance, it may not be able to achieve the desired value for the down impedance, and vice versa.

Furthermore, note that matching the impedances only once (e.g., during a calibration phase at start-up) may not be sufficient because the electrical characteristics of circuit elements can change during operation. Hence, even if the impedances are matched during the calibration phase, they may drift apart during operation.

Some approaches calibrate the n-type and p-type transistors separately and provide different gate voltages to these transistors. Unfortunately, these approaches require complex circuitry to generate the appropriate gate voltages, which increases the design area. Other approaches control one of the impedances by varying the supply voltage of a pre-driver. However, these approaches require complex circuitry to vary the supply voltage, and can increase timing skew. In addition, these approaches can require two off-chip resistors, which can add to the cost.

Some embodiments of the present invention provide circuitry for matching the up and down impedances of a voltage-mode transmitter without the above-described drawbacks.

Figure 3:
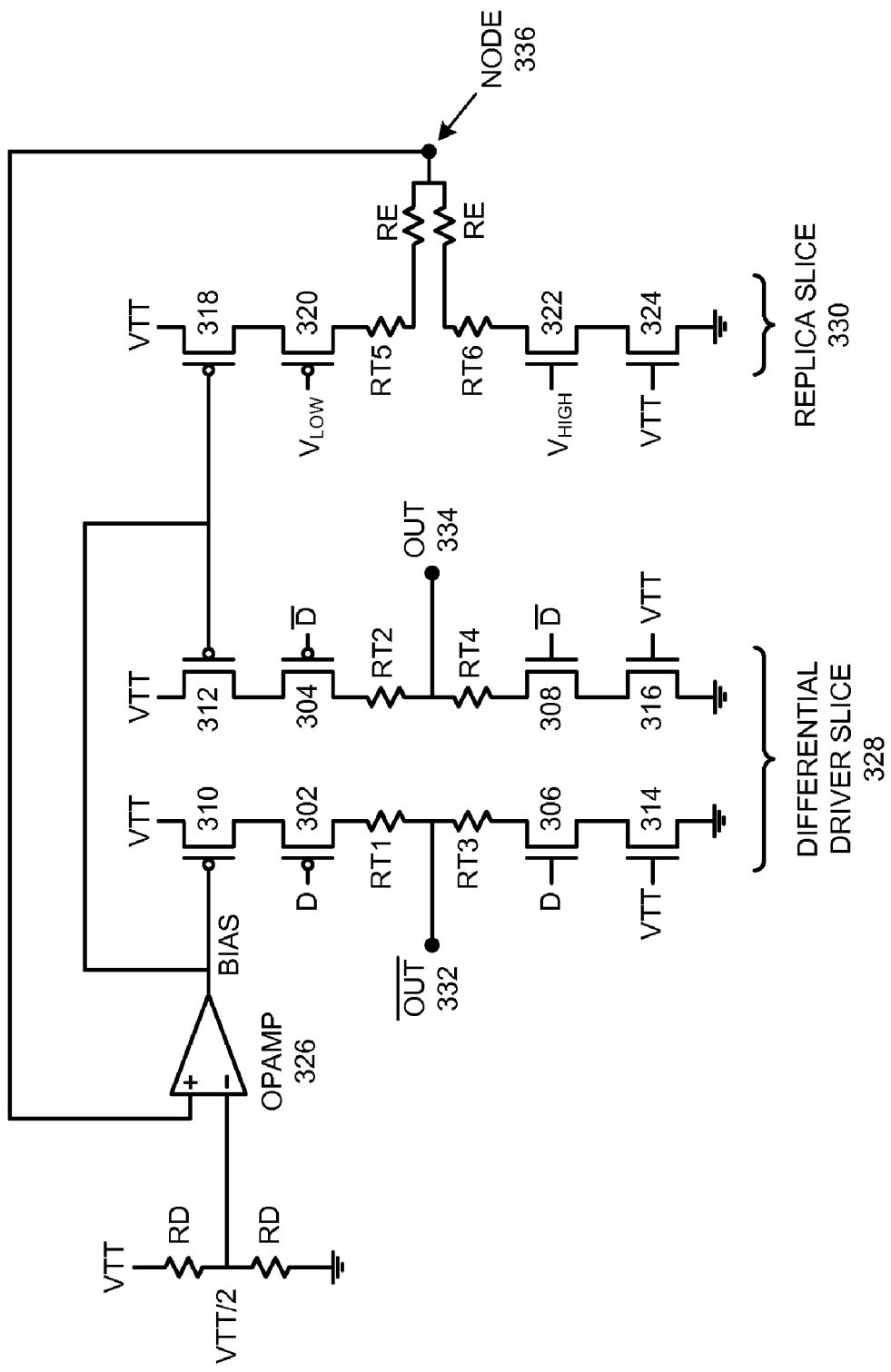
FIG. 3 illustrates a portion of a voltage-mode differential transmitter which includes bias circuitry for matching up and down impedances in accordance with some embodiments of the present invention.

FIG. 3 illustrates a portion of a voltage-mode differential transmitter which includes bias circuitry for matching up and down impedances in accordance with some embodiments of the present invention.

A voltage-mode differential transmitter can include multiple differential driver slices, such as differential driver slice 328. Differential driver slice 328 includes driver transistors 302, 304, 306, and 308 which generate a differential voltage-mode signal at driver slice outputs 332 and 334 (note that the outputs from the multiple driver slices are coupled together as shown in FIG. 1). In a single-ended transmitter, each driver slice may include only one half (e.g., the left half or the right half) of a differential driver slice. The up impedance at output 332 is primarily determined by resistance RT1 and transistors 302 and 310, and the down impedance is primarily determined by resistance RT3 and transistors 306 and 314. The up impedance at output 334 is primarily determined by resistance RT2 and transistors 304 and 312, and the down impedance is primarily determined by resistance RT4 and transistors 308 and 316.

Transistors 310 and 312 are designed to enable the transmitter to control the up impedance. Transistors 314 and 316 may be designed to match the impedance of transistors 310 and 312, respectively, under nominal process and/or operating conditions. These transistors—i.e., transistors 310, 312, 314, and 316—are referred to as impedance-matching transistors. Note that the impedance-matching transistors are coupled with the driver transistors in series. In some embodiments, in addition to being used for impedance-matching purposes, transistors 314 and 316 are also used for turning off the differential driver slice by bringing their gate voltages down to ground.

The bias circuitry can include operational amplifier 326, the two resistances labeled RD, and replica slice 330. Replica slice 330 can include transistors which match the corresponding transistors in the differential driver slice 328. Specifically, transistor 318 can match transistors 310 and 312, transistor 320 can match transistors 302 and 304, transistor 322 can match transistors 306 and 308, and transistor 324 can match transistors 314 and 316. Further, resistance RT5 can match resistances RT1 and RT2, and resistance RT6 can match resistances RT3 and RT4. The two resistances labeled RE are designed to match the expected transmitter load impedance. Transistor 320 can be supplied a gate voltage $V_{LOW}$ which can correspond to the gate voltage associated with data bit "0." Transistor 322 can be supplied a gate voltage $V_{HIGH}$ which can correspond to the gate voltage associated with data bit "1."

Note that, if the up and down impedances at node 336 match, the voltage at node 336 will be equal to VTT/2, which is the average of the voltages at the two power supply nodes. Furthermore, if the up and down impedances of replica slice 330 match, then the up and down impedances of differential driver slice 328 will also match because the transistors and resistors in replica slice 330 match the corresponding transistors and resistors in differential driver slice 328.

In other words, if we can force the voltage at node 336 to stay at VTT/2, then it would cause the up and down impedances of differential driver slice 328 to match.

Operational amplifier 326 is configured in a negative feedback loop that forces the voltage at node 336 to be equal to VTT/2. Specifically, one input of operational amplifier 326 is supplied a VTT/2 voltage, e.g., by using a voltage divider (the two resistances labeled RD). The other input is coupled to node 336. The output of the operational amplifier is supplied as a gate bias to impedance-matching transistors 310, 312, and 318. This negative feedback loop forces the voltage at node 336 to be equal to VTT/2, thereby ensuring that the up and down impedances of the driver slices match each other.

The transmitter can configure a subset of differential driver slices so that the down impedance matches a desired value (note that the desired value may be partly or solely based on an impedance value specified in a communication standard). This driver configuration operation can be performed at startup, and optionally repeated periodically during operation. The bias circuitry will automatically ensure that the up impedance matches the down impedance. Note that the up and down impedances will remain matched even when operating conditions (e.g., power supply voltage and/or temperature) change because the bias circuitry continuously adjusts the bias of the impedance-matching transistors so that the up and down impedances match each other.

The driver slices which are biased using a replica slice need to match the replica slice. However, different driver slices may have different characteristics due to several factors, for example the different orientations of the driver slices. In such situations, the transmitter may include multiple replica slices (with the associated bias circuitry), so that each driver slice can be biased using a matching replica slice. For example, a transmitter design may include a replica slice for every eight driver slices.

In some embodiments, transistors 314 and 316 can be omitted, i.e., the sources of transistors 306 and 308 can be directly coupled to ground. In these embodiments, the layouts of resistances RT3 and RT4 and/or transistors 306 and 308 may need to be adjusted to ensure that the up impedance is substantially close to the down impedance.

Further, in some embodiments, a single impedance-matching transistor can be used in place of two impedance-matching transistors. For example, in these embodiments, the source of impedance-matching transistor 310 can be coupled in series with the drains of driver transistors 302 and 304. Similarly, the drain of impedance-matching transistor 314 can be serially coupled with the sources of transistors 306 and 308.

Note that many modifications and variations will be apparent to one of ordinary skill in the art. For example, in some embodiments, the up impedance can be controlled by configuring the appropriate number of driver slices, and the down impedance can then be matched with the up impedance by using the bias circuit. In these embodiments, the bias voltage is supplied to the n-type transistors (e.g., transistors 314 and 316) instead of the p-type transistors as shown in FIG. 3. Note that the inputs to the operational amplifier may need to be switched in some embodiments to maintain a negative feedback loop.

Figure 4:
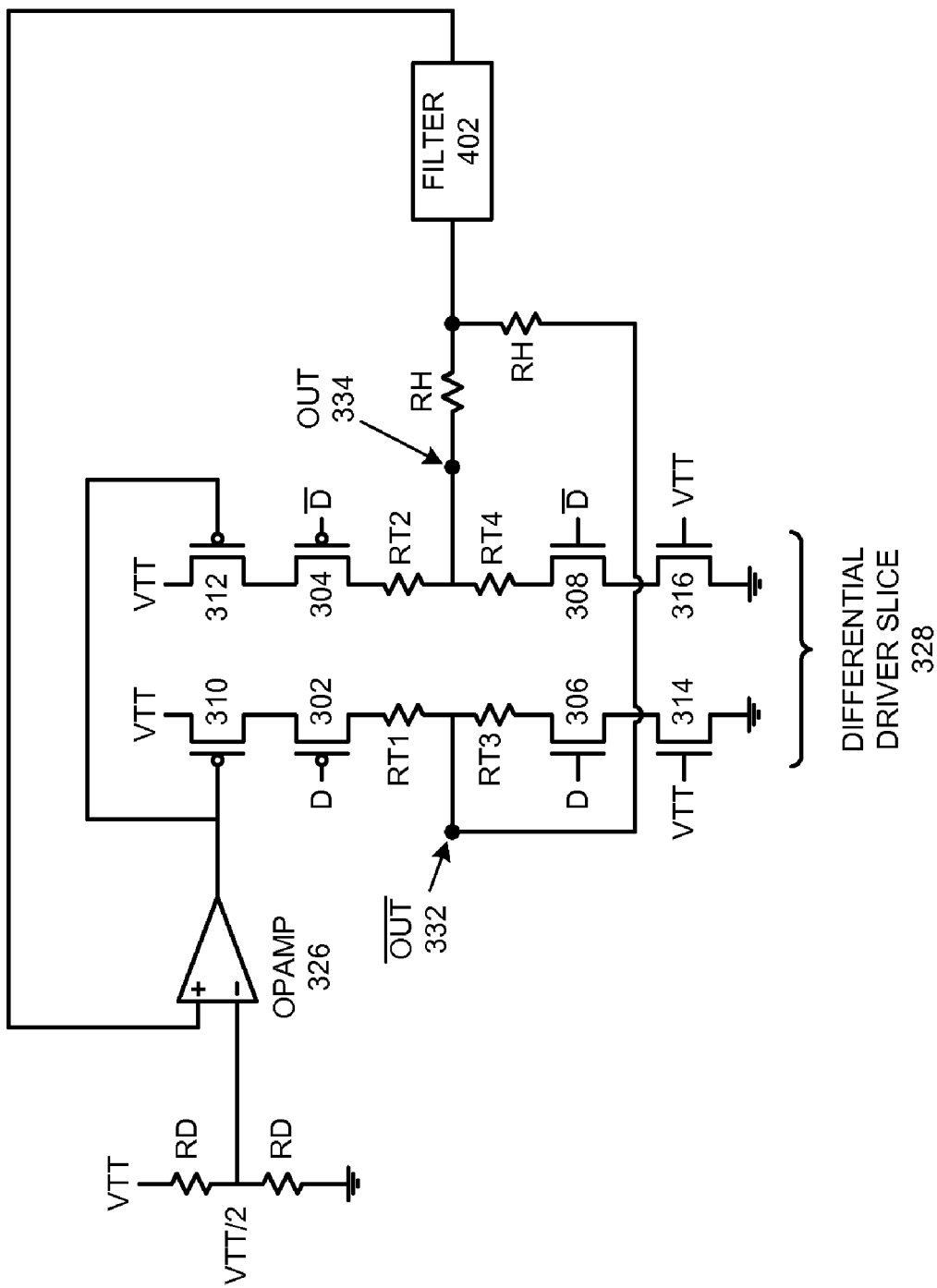
FIG. 4 illustrates a portion of a voltage-mode differential transmitter which includes bias circuitry for matching up and down impedances in accordance with some embodiments of the present invention.

FIG. 4 illustrates a portion of a voltage-mode differential transmitter which includes bias circuitry for matching up and down impedances in accordance with some embodiments of the present invention.

The bias circuitry shown in FIG. 4 does not use replica slices. Instead, the bias circuitry uses the output from the transmitter (instead of replica slices) to form a negative feedback loop. An output of a single-ended or differential driver slice typically carries a high frequency voltage signal. Filter 402 can be used to extract the DC-level of the single-ended or differential output signal. In particular, filter 402 can be coupled with the transmitter's output(s) using resistances RH. Next, the extracted DC-level can then be supplied as an input to operational amplifier 326. Filter 402 can be any filter that can extract a DC-level from a time-varying differential signal. For example, filter 402 can be a low-pass filter.

Figure 5:
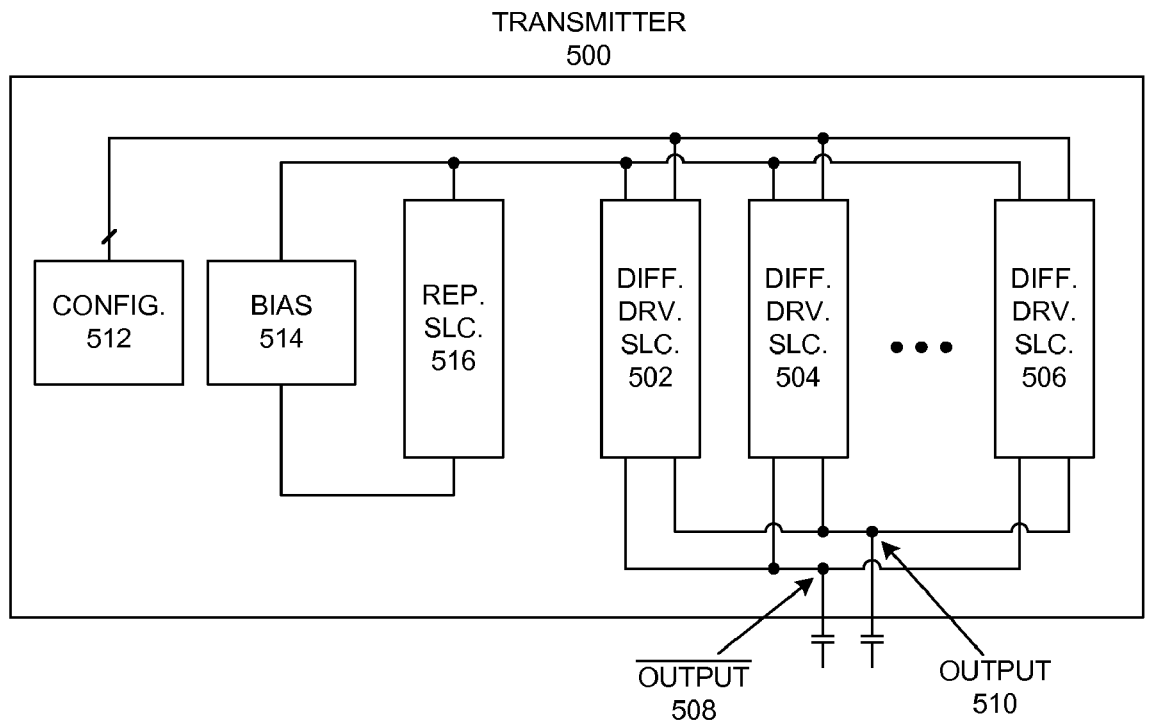
FIG. 5 illustrates a block diagram of a voltage-mode differential transmitter which is capable of matching the up and down impedance in accordance with some embodiments of the present invention.

FIG. 5 illustrates a block diagram of a voltage-mode differential transmitter which is capable of matching the up and down impedance in accordance with some embodiments of the present invention.

Transmitter 500 can include configuration circuitry 512, bias circuitry 514, replica slice 516, and differential driver slices 502, 504, and 506. The differential outputs of each differential driver slice (e.g., driver slices 502, 504, and 506) are coupled with the transmitter's differential outputs 508 and 510. The transmitter's differential outputs 508 and 510 can be capacitively coupled with the transmission channels (e.g., signal traces on the circuit board). During operation, each differential driver slice outputs a voltage signal which is combined to create the transmitter's differential voltage signal. The impedance at the transmitter's differential outputs is determined by combining the impedances of the differential driver slices in parallel.

Configuration circuitry 512 can be used to configure an appropriate number of driver slices so that the down impedance of transmitter 500 is substantially equal to a desired value. For example, configuration circuitry 512 can supply voltage signals associated with data bit D and its complement D to the gates of the driver transistors in a subset of differential driver slices, and switch off the remaining differential driver slices (e.g., by supplying the appropriate gate voltages or by bringing the gate voltages of transistors 314 and 316 in FIG. 3 to ground). Bias circuitry 514 in conjunction with replica slice 516 can be used to ensure that the up impedance of the transmitter matches the down impedance. Although not shown in FIG. 5, some embodiments use multiple replica slices to bias the driver slices. In some embodiments, transmitter 500 may not include replica slice 516; instead, outputs 508 and 510 may be coupled with bias circuitry 514 through a filter that is capable of extracting a DC-level from a time varying differential signal. In a single-ended transmitter, each driver slice may have a single output (as opposed to a pair of differential outputs) which may be coupled with the transmitter's output.

Figure 6:
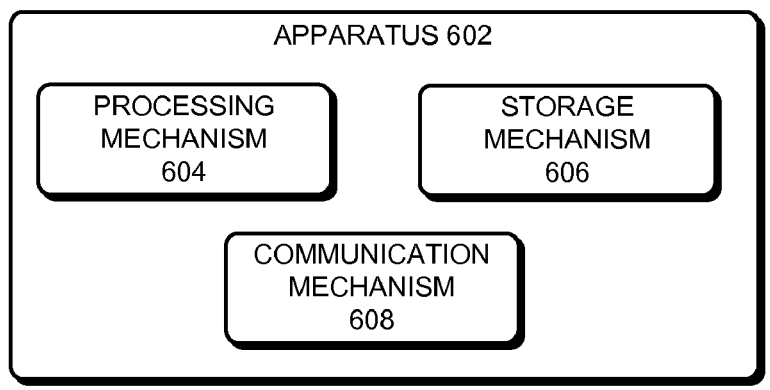
FIG. 6 illustrates an apparatus in accordance with some embodiments of the present invention.

FIG. 6 illustrates an apparatus in accordance with some embodiments of the present invention.

Apparatus 602 can comprise a plurality of mechanisms which may communicate with one another via a wired or wireless communication channel. Apparatus 602 may be realized using one or more integrated circuits, and apparatus 602 may include fewer or more mechanisms than those shown in FIG. 6. Further, apparatus 602 may be integrated in a computer system, or it may be realized as a separate device which is capable of communicating with other computer systems and/or devices. Specifically, apparatus 602 can include processing mechanism 604, storage mechanism 606, and communication mechanism 608.

Processing mechanism 604 can generally be any mechanism that can perform computations. Specifically, processing mechanism 604 can be a microprocessor which may include multiple processing cores, a network processor, a digital-signal-processor, a processor used in a portable computing and/or communication device (e.g., a smart phone), or any other processing mechanism now known or later developed.

Storage mechanism 606 can include any non-transitory computer-readable storage medium or device. Specifically, storage mechanism 606 can include volatile memory, non-volatile memory, magnetic and optical storage devices such as disk drives, magnetic tape, CDs (compact discs), DVDs (digital versatile discs or digital video discs), or other media or device, now known or later developed, that is capable of storing code and/or data.

Communication mechanism 608 can generally include any mechanism that enables apparatus 602 to communicate with other devices, apparatuses, and/or computers. Specifically, communication mechanism 608 can include one or more receivers and one or more transmitters. The transmitters in communication mechanism 608 can include circuitry for matching the up and down impedances. In one embodiment, communication mechanism 608 includes a high-speed serial interface.

Processing mechanism 604 and communication mechanism 608 may be capable of accessing data stored in storage mechanism 606. For example, communication mechanism 608 may receive data from a network and store the data in storage mechanism 606. Next, processing mechanism 604 may manipulate the data stored in storage mechanism 606, and communication mechanism 608 may transmit the manipulated data back to the network.

CONCLUSION

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. The methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A voltage-mode transmitter, comprising:
  a set of driver slices, wherein each driver slice includes driver transistors, wherein an output of each driver slice is coupled to a transmitter output, and wherein each driver slice includes one or more impedance-matching transistors which are serially coupled to at least some of the driver transistors;
  configuration circuitry to configure a subset of driver slices so that a first impedance value between the transmitter output and a first power supply node is within a first tolerance of a desired impedance value; and
  bias circuitry to bias the one or more impedance-matching transistors in each driver slice in the subset of driver slices so that a second impedance value between the transmitter output and a second power supply node is within a second tolerance of the first impedance value.

2. The voltage-mode transmitter of claim 1, wherein the bias circuitry comprises:
- a replica slice, which includes replica driver transistors, and a replica impedance-matching transistor which is serially coupled to the replica driver transistors; and
- an operational amplifier, wherein a first input of the operational amplifier receives a voltage value that is an average of the voltage values of the first power supply node and the second power supply node, wherein a second input of the operational amplifier is coupled to the output of the replica slice, and wherein an output voltage of the operational amplifier is supplied as a bias voltage to the replica impedance-matching transistor in the replica slice and the impedance-matching transistors in the set of driver slices.

3. The voltage-mode transmitter of claim 2, wherein the bias circuitry includes multiple replica slices, wherein the replica slices are used for biasing driver slices which match the replica slices.

4. The voltage-mode transmitter of claim 2, wherein some of the impedance-matching transistors in a driver slice are used to switch the driver slice on or off.

5. The voltage-mode transmitter of claim 1, wherein the bias circuitry comprises:
- a filter which is coupled to the transmitter output; and
- an operational amplifier, wherein a first input of the operational amplifier receives a voltage value that is an average of the voltage values of the first power supply node and the second power supply node, wherein a second input of the operational amplifier is coupled to the output of the filter, and wherein an output voltage of the operational amplifier is supplied as a bias voltage to the impedance-matching transistors in the set of driver slices.

6. The voltage-mode transmitter of claim 1, wherein each driver slice is capable of being configured to perform one of: a driver function, an attenuation function, or an equalization function.

7. The voltage-mode transmitter of claim 1, wherein the voltage-mode transmitter is a voltage-mode differential transmitter.

8. The voltage-mode transmitter of claim 1, wherein the voltage-mode transmitter is a voltage-mode single-ended transmitter.

9. A communication device, comprising:
- a receiver; and
- a voltage-mode transmitter, comprising:
  - a set of driver slices, wherein each driver slice includes driver transistors, wherein an output of each driver slice is coupled to a transmitter output, and wherein each driver slice includes one or more impedance-matching transistors which are serially coupled to at least some of the driver transistors;
  - configuration circuitry to configure a subset of driver slices so that a first impedance value between the transmitter output and a first power supply node is within a first tolerance of a desired impedance value; and
  - bias circuitry to bias the one or more impedance-matching transistors in each driver slice in the subset of driver slices so that a second impedance value between the transmitter output and a second power supply node is within a second tolerance of the first impedance value.

10. The communication device of claim 9, wherein the bias circuitry comprises:
- a replica slice, which includes replica driver transistors, and a replica impedance-matching transistor which is serially coupled to the replica driver transistors; and
- an operational amplifier, wherein a first input of the operational amplifier receives a voltage value that is an average of the voltage values of the first power supply node and the second power supply node, wherein a second input of the operational amplifier is coupled to the output of the replica slice, and wherein an output voltage of the operational amplifier is supplied as a bias voltage to the replica impedance-matching transistor in the replica slice and the impedance-matching transistors in the set of driver slices.

11. The communication device of claim 10, wherein the bias circuitry includes multiple replica slices, wherein the replica slices are used for biasing driver slices which match the replica slices.

12. The communication device of claim 10, wherein some of the impedance-matching transistors in a driver slice are used to switch the driver slice on or off.

13. The communication device of claim 9, wherein the bias circuitry comprises:
- a filter which is coupled to the transmitter output; and
- an operational amplifier, wherein a first input of the operational amplifier receives a voltage value that is an average of the voltage values of the first power supply node and the second power supply node, wherein a second input of the operational amplifier is coupled to the output of the filter, and wherein an output voltage of the operational amplifier is supplied as a bias voltage to the impedance-matching transistors in the set of driver slices.

14. The communication device of claim 9, wherein each driver slice is capable of being configured to perform one of: a driver function, an attenuation function, or an equalization function.

15. The communication device of claim 9, wherein the voltage-mode transmitter is a voltage-mode differential transmitter.

16. The communication device of claim 9, wherein the voltage-mode transmitter is a voltage-mode single-ended transmitter.

17. An apparatus, comprising:
- a processing mechanism;
- a storage mechanism; and
- a communication mechanism which includes a voltage-mode transmitter, the voltage-mode transmitter comprising:
  - a set of driver slices, wherein each driver slice includes driver transistors, wherein an output of each driver slice is coupled to a transmitter output, and wherein each driver slice includes one or more impedance-matching transistors which are serially coupled to at least some of the driver transistors;
  - configuration circuitry to configure a subset of driver slices so that a first impedance value between the transmitter output and a first power supply node is within a first tolerance of a desired impedance value; and
  - bias circuitry to bias the one or more impedance-matching transistors in each driver slice in the subset of driver slices so that a second impedance value between the transmitter output and a second power supply node is within a second tolerance of the first impedance value.

18. The apparatus of claim 17, wherein the bias circuitry comprises:
- a replica slice, which includes replica driver transistors, and a replica impedance-matching transistor which is serially coupled to the replica driver transistors; and
- an operational amplifier, wherein a first input of the operational amplifier receives a voltage value that is an average of the voltage values of the first power supply node and the second power supply node, wherein a second input of the operational amplifier is coupled to the output of the replica slice, and wherein an output voltage of the operational amplifier is supplied as a bias voltage to the replica impedance-matching transistor in the replica slice and the impedance-matching transistors in the set of driver slices.

19. The apparatus of claim 18, wherein the bias circuitry includes multiple replica slices, wherein the replica slices are used for biasing driver slices which match the replica slices.

20. The apparatus of claim 18, wherein some of the impedance-matching transistors in a driver slice are used to switch the driver slice on or off.

21. The apparatus of claim 17, wherein the bias circuitry comprises:
- a filter which is coupled to the transmitter output; and
- an operational amplifier, wherein a first input of the operational amplifier receives a voltage value that is an average of the voltage values of the first power supply node and the second power supply node, wherein a second input of the operational amplifier is coupled to the output of the filter, and wherein an output voltage of the operational amplifier is supplied as a bias voltage to the impedance-matching transistors in the set of driver slices.

22. The apparatus of claim 17, wherein each driver slice is capable of being configured to perform one of: a driver function, an attenuation function, or an equalization function.

23. The apparatus of claim 17, wherein the voltage-mode transmitter is a voltage-mode differential transmitter.

24. The apparatus of claim 17, wherein the voltage-mode transmitter is a voltage-mode single-ended transmitter.

* * * * *